(12) United States Patent
Nishiyama et al.

(10) Patent No.: US 7,136,543 B2
(45) Date of Patent: Nov. 14, 2006

(54) MOUNT ASSEMBLY, OPTICAL TRANSMISSION LINE AND PHOTOELECTRIC CIRCUIT BOARD

(75) Inventors: Tousaku Nishiyama, Nara (JP); Yukihiro Ishimaru, Hirakata (JP); Yasuhiro Sugaya, Toyonaka (JP); Toshiyuki Asahi, Osaka (JP); Seiji Karashima, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 10/879,067

(22) Filed: Jun. 30, 2004

(65) Prior Publication Data

US 2005/0002608 A1    Jan. 6, 2005

(30) Foreign Application Priority Data

Jul. 1, 2003    (JP)    ............................. P2003-189339

(51) Int. Cl.
  *G02B 6/12*    (2006.01)
  *H01L 3/00*    (2006.01)
(52) U.S. Cl. ............................ 385/1.4; 385/31; 385/33; 385/88; 385/92; 385/93; 257/459; 257/466
(58) Field of Classification Search .................. 385/14, 385/31, 33, 49, 88, 89, 92, 93, 94, 147, 900, 385/901; 257/459, 466
See application file for complete search history.

(56) References Cited

U.S. PATENT DOCUMENTS

| | | | | |
|---|---|---|---|---|
| 4,173,494 A | * | 11/1979 | Johnson et al. ............. | 136/250 |
| 5,955,776 A | | 9/1999 | Ishikawa ...................... | 257/618 |
| 6,004,396 A | | 12/1999 | Ishikawa ...................... | 118/715 |
| 6,204,545 B1 | * | 3/2001 | Nakata ......................... | 257/459 |
| 6,417,442 B1 | * | 7/2002 | Fukui et al. ................. | 136/250 |
| 6,977,820 B1 | * | 12/2005 | Uchida ......................... | 361/761 |
| 2005/0002608 A1 | * | 1/2005 | Nakata ......................... | 385/31 |

FOREIGN PATENT DOCUMENTS

| | | | | |
|---|---|---|---|---|
| JP | 2000-216335 | 8/2000 | ............... | 385/88 X |
| JP | 2000-349224 | 12/2000 | ............... | 385/88 X |
| JP | 2001-185744 | 7/2001 | ............... | 385/88 X |

* cited by examiner

*Primary Examiner*—Brian M. Healy
(74) *Attorney, Agent, or Firm*—Wenderoth, Lind & Ponack, L.L.P.

(57) ABSTRACT

A mount assembly which amplifies a light signal from an optical transmission line and transmits the light signal to another optical transmission line and does not require a highly precise perpendicularity at a connection portion between the optical transmission line and the mount assembly. The mount assembly (100) is obtained by connecting a photo-electro conversion device (10a), spherical semiconductor devices (12a) and (12b) and an electro-photo conversion device (10b) through electrical-connection portions (14) so that a light received by the photo-electro conversion device (10a) is amplified by the spherical semiconductor devices (12a) and (12b) and then emitted from the electro-photo conversion device (10b).

18 Claims, 9 Drawing Sheets

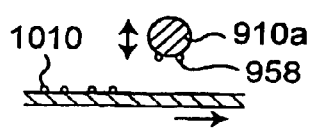
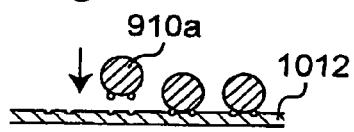
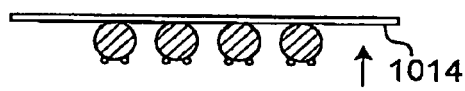
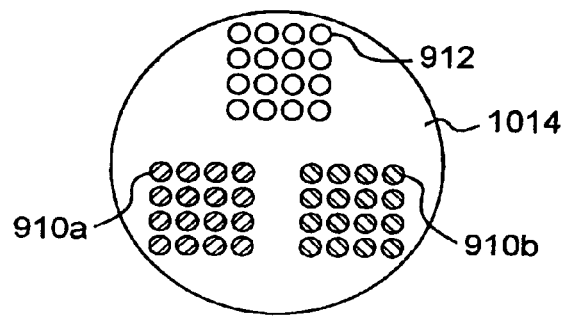
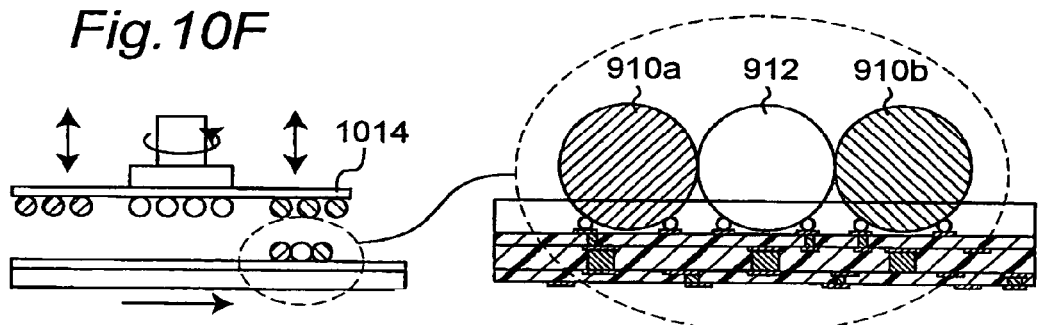
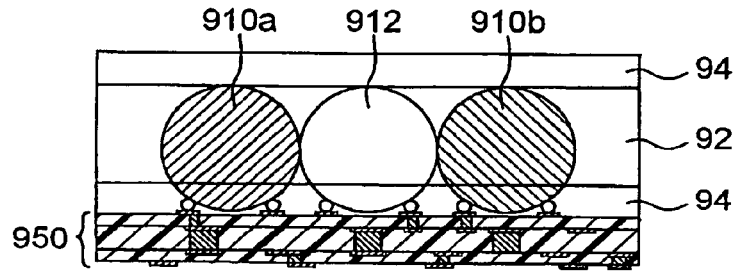

*Fig. 13A*     *Fig. 13B*     *Fig. 13C*
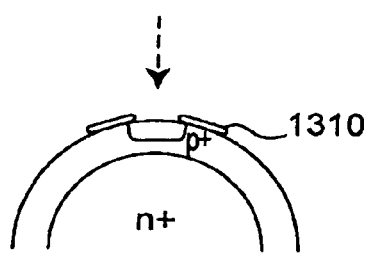 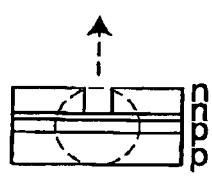 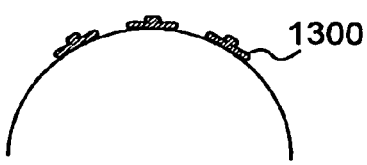
*Fig. 14*
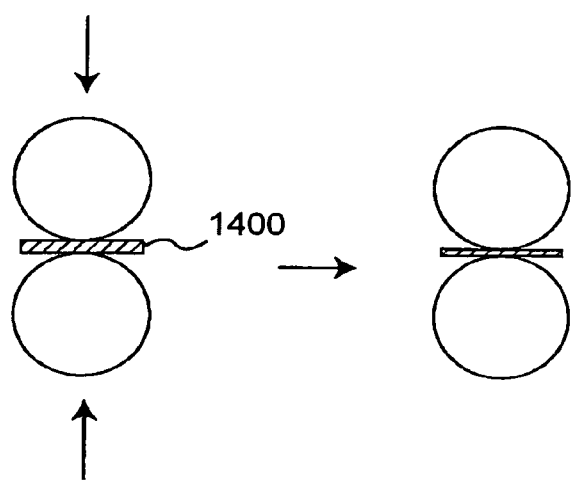

MOUNT ASSEMBLY, OPTICAL TRANSMISSION LINE AND PHOTOELECTRIC CIRCUIT BOARD

CROSS-REFERENCE TO RELATED APPLICATIONS

The present application claims priority under 35 U.S.C. §119 to Japanese Patent Application No. 2003-189339 filed on Jul. 1, 2003, entitled "Spherical semiconductor device and mount assembly using the same and electronic equipment using the same." The contents of that application are incorporated herein by reference thereto in their entirety.

TECHNICAL FIELD

The present invention relates to a mount assembly wherein a spherical photoelectric conversion device and a spherical semiconductor device that forms an electronic circuit are electrically connected to each other, and an optical transmission line and a photoelectric circuit board which use the mount assembly.

BACKGROUND OF THE INVENTION

In the field of electronic equipment, such as a cellular phone, a book-size personal computer and a PDA (personal digital assistance) which all require high-speed communication, a production which realizes higher-speed communication is desired to be provided in a smaller, thinner and lighter form. For this reason, miniaturization of the products in this field is rapidly advancing. Further, these products are also required to have higher performance and multifunctionality in addition to a smaller size. In order to meet the requirements, microminiaturization of a semiconductor device has been accelerated and a new structure of the device has been developed while a mounting technique for mounting electronic components has advanced, which results in a significantly higher density and a significantly higher speed in an electronic circuit.

However, there is a limitation to the communication speed of the electronic equipment as long as the electrical signal is conventionally transmitted and received. In this situation, recently, a necessary signal is transmitted and received as a light signal using an optical fiber.

Meanwhile, in a semiconductor field, a spherical semiconductor chip has been proposed and such a chip has been applied and developed in various fields including the high-density semiconductor device field and the medical field. For example, Ball Semiconductor, Inc. (Allen, Tex., US) has proposed that a semiconductor circuit is formed on a surface of a sphere of 1 mm diameter and such a spherical semiconductor circuit is applied in a microminiature electronic equipment such as a card-type electronic equipment (see U.S. Pat. No. 5,955,776 and U.S. Pat. No. 6,004,396). Further, various proposals have been made with respect to a technique for connecting the spherical semiconductor devices with each other and a technique for mounting the spherical semiconductor device on a wiring board directly (see Japanese Patent Kokai (Laid-Open) Publication Nos. 2000-216335 (FIG. 1) and 2000-349224 (FIG. 2)). Furthermore, a solar cell which employs the spherical semiconductor device has been also proposed (see Japanese Patent Kokai (Laid-Open) Publication No. 2001-185744). These intend to realize a higher speed and a miniaturization of the electronic circuit by using a spherical shape of the semiconductor device.

SUMMARY OF THE INVENTION

The inventors of the present invention have studied employing the spherical semiconductor device in an optical communication technology in view of the fact that optical communication tends to be employed in the field of electronic equipment. In the optical communication, a light signal may be required to be amplified in a communication line in some cases. For this purpose, another circuit (an amplifying circuit) may be provided in an optical communication system. This circuit derives a light signal from a fiber cable and converts the light signal to an electrical signal and then amplifies the electrical signal. The amplification circuit may result in lower speed and increased cost. Further, in the amplification circuit, it is generally difficult to achieve a desired connection precision upon connecting a light-receiving device and the optical fiber since a highly precise perpendicularity is required between the light signal which is emitted from the optical fiber and the light-receiving device.

Although the technology disclosed in the above-mentioned documents makes it possible to obtain an excellent effect employing a feature conferred by the spherical shape of the semiconductor, a sufficiently practical mount structure has not been achieved and therefore the application thereof is limited. Further, the geometrical feature of the spherical semiconductor device is not sufficiently recognized and it is predominantly considered that a planar super-svelte chip semiconductor is enough to be mounted on a product. For this reason, in actuality, the spherical semiconductor device has not come into wide use.

The present invention has been made in consideration of this situation and an object thereof is to provide a useful and practical mount assembly for the optical communication system by using the feature of a spherical semiconductor device.

The present invention provides a mount assembly which emits a light signal corresponding to an incident light signal and includes:

at least two photoelectric conversion devices; and at least one spherical semiconductor device which forms an electronic circuit, wherein at least one photoelectric conversion device is a device for converting a light signal to an electrical signal and at least one photoelectric conversion device is a device for converting an electrical signal to a light signal, at least one photoelectric conversion device is a spherical photoelectric conversion device which has a photoelectric conversion portion formed on a surface of a substantially spherical semiconductor material, the spherical semiconductor device is disposed between the device for converting the light signal to the electrical signal and the device for converting the electrical signal to the light signal, and the devices are electrically connected.

The term "mount assembly" means an assembly which includes at least one semiconductor device that is electrically connected to another semiconductor device or a component so that the assembly effects one function as a whole. The mount assembly according to the present invention has at least a basic function of receiving an incident light signal and emitting a light signal corresponding to the incident light, and an additional function of, for example, amplifying the incident light or emitting a light signal having a particular wavelength. In the above, "emitting a light signal corresponding to an incident light" means that no light is emitted from the assembly if a light signal does not enter the assembly, that is, an emitted light depends on the incident light.

The mount assembly of the present invention includes at least two photoelectric conversion devices. The photoelectric conversion devices include a device which converts a light signal to an electrical signal and a device which converts an electrical signal to a light signal. In this specification, these two types of devices are collectively referred to as the "photoelectric conversion device." The photoelectric conversion device which constitutes the mount assembly of the present invention has a circuit for transmitting the electrical signal to another device or receiving the electrical signal from another device, in addition to a structure necessary for photoelectric conversion. In the mount assembly of the present invention, at least one photoelectric conversion device converts the light signal to the electrical signal and at least one photoelectric conversion device converts an electrical signal to a light signal. These devices are needed in order to realize the function of emitting the light signal corresponding to the incoming light signal. In this specification, the term "photoelectric conversion device" is used as a generic name of these devices and the device which converts the light signal to the electrical signal is indicated as a "photo-electro conversion device" and the device which converts the electrical signal to the light signal is indicated as an "electro-photo conversion device" for convenience.

In the mount assembly of the present invention, at least one spherical semiconductor device which forms an electronic circuit is placed between the photo-electro conversion device and the electro-photo conversion device, and at least one photoelectric conversion device is spherical. Therefore, the mount assembly of the present invention has a construction having a series of two spherical devices, whereby the mount assembly of the present invention can be constructed to adapt to a curved path or a bend path. It should be noted that the term "sphere" not only means a complete sphere, but also includes another shape, such as an oval sphere, which gives the same effect as the complete sphere.

Said at least one spherical photoelectric conversion device gives the below described advantage or feature to the mount assembly of the present invention. For example, when the photo-electro conversion device is spherical, it gives perpendicular planes to lights in more various directions compared with a planar device. Therefore, when an angle between a light path of the incident light and the photo-electro conversion device is deviated from 90 degree at a contact portion between an optical fiber and the device, a larger tolerance for the deviation can be obtained. This is the case when the electro-photo conversion device is spherical. Therefore, either or both of the receiving-side and emitting-side devices are spherical, the optical fiber and the mount assembly are easily connected. In the mount assembly of the present invention, it is preferable that all the photoelectric conversion devices are spherical.

When the spherical photo-electric conversion device is constructed, for example, by mounting a plurality of optical devices to a spherical electronic circuit device, so that it can receive lights from a plurality of optical transmission lines, an omnidirection of the sphere enables lights to enter one device from a plurality of directions without limiting the incident direction. Such a photo-electro conversion device makes it possible to construct a mount assembly having an optical switch circuit. Similarly when the omnidirection of the sphere is used for constructing the electro-photo conversion device such that the device emits lights in a plurality of directions, the mount assembly can emit lights in a plurality of directions as desired.

Further, in the mount assembly of the present invention, the devices are electrically connected. Herein, the term "device" is used to refer to both of the photoelectric conversion device and the spherical semiconductor device which constitute the mount assembly. The phrase "the devices are electrically connected" means that all the devices are connected so that it forms a desired circuit depending on a function of the mount assembly. The devices are electrically connected by, for example, mounting each device on a circuit board so that a wire formed on the circuit board provides an electrical connection. In that case, the circuit board is an element of the mount assembly. Alternatively, the devices are electrically connected by contacting one device to another device(s) through an electrical-connection portion such as a bump.

The mount assembly of the present invention may includes, for example, a conventional planar semiconductor device or a conventional planar photoelectric conversion device as long as the mount assembly has at least two spherical devices. The semiconductor devices and the photoelectric conversion devices of the mount assembly are preferably all spherical. Such a mount assembly is identified as a mount assembly which includes:

"n" spherical photoelectric conversion devices (wherein "n" is an integer equal to or more than two); and "x" spherical semiconductor devices which form an electronic circuit (wherein "x" is an integer equal to or more than 1), wherein "a" spherical photoelectric conversion devices are photo-electro conversion devices (wherein "a" is an integer equal to or more than 1 and a<n), "n–a" spherical photoelectric conversion devices are electro-photo conversion devices, the "x" spherical semiconductor devices are disposed between the photo-electro conversion devices and the electro-photo conversion devices, and the devices are electrically connected.

For example, when n=2 and x=1, a mount assembly wherein one spherical semiconductor device is disposed between one photo-electro conversion device and one electro-photo device is obtained. Such a mount assembly may be in a line form wherein all the devices are aligned, or a bended form wherein a line which connects centers of the devices forms an angle "α" (α≠180°). When "n" is two and "x" is two or more, other various forms may be obtained in addition to these forms. For example, a zigzag form may be obtained.

The number of the photoelectric conversion devices may be three or more (that is, "n" may be three or more). In that case, the number of the photo-electro conversion devices may be one (that is, a=1) and the number of the electro-photo conversion devices may be two or more (that is, "n–a" is two or more), whereby the mount assembly can receive the incident light signal from a single direction, and divide and emit the light in two or more directions.

At least a part of the mount assembly of the present invention may be covered with a transparent resin. By covering at least a part of the mount assembly with the resin, the mount assembly can be obtained as a structure wherein a plurality of devices are integrated by the resin without effecting incidence and emission of light. Such a mount assembly has an improved handling performance. Further, the mount assembly has an improved reliability because the photoelectric conversion device and the spherical semiconductor device are protected by the resin, and the mount assembly can be advantageously used in the optical communication and energy supply fields which require trouble-free operation for a long term.

A passive component may be mounted on the mount assembly of the present invention. The passive components include a coil, a resistance, and a capacitor. When a part of the mount assembly is covered with the resin, the resin may cover also the passive component. For example, the passive component may be buried in the resin.

The present invention also provides an optical transmission line which includes the mount assembly of the present invention. Specifically, the optical transmission line of the present invention includes a core layer and a clad layer, wherein the mount assembly of the present invention is disposed within the core layer. Herein the phrase "the mount assembly is disposed within the core layer" includes not only an embodiment wherein the mount assembly is disposed only within the core layer, but also an embodiment wherein the mount assembly extends across the core layer and the clad layer. In this optical transmission line, the mount assembly disposed within the core layer makes it possible to amplify a light signal which propagates through the optical transmission line or allows a light signal having a particular wavelength to propagate through a path beyond a predetermined position.

In the case where the optical transmission line of the present has a bend portion, the mount assembly of the present invention is preferably disposed in the bend portion. When an optical path bends at a right angle in a conventional optical transmission line, a light signal should be reflected on a face which is formed by cutting the optical transmission line at 45° to the optical path as shown in FIG. 7C. A metal film is formed on the cut face in order to increase a reflectance, if necessary. The cutting of the optical transmission line and the forming of the metal film complicate the manufacturing process and disadvantageously increase a transmission loss. In the case where the mount assembly of the present invention is placed at the bend portion, a signal to be transmitted is transferred as an electrical signal between the devices at the portion where the propagation direction bends at a right angle as shown in FIG. 7B, which eliminates the cutting of the optical transmission line and decreases the transmission loss.

In the case where the optical transmission line of the present invention has a branch portion, the mount assembly of the present invention is preferably disposed in the branch portion. In that case, the mount assembly has two or more electro-photo conversion devices or a single electro-photo conversion device which emits light signals in a plurality of directions. When an optical path branch is required in a conventional optical transmission line, a radius of curvature should be large as shown in FIG. 8B in order to reduce a signal loss. In the case where the mount assembly of the present invention is placed at the branch portion, the light signal can be transmitted as the electrical signal at the branch portion and therefore the branch portion can be formed at a steeper angle as shown in FIG. 8A.

The present invention also provides a photoelectric circuit board wherein an optical transmission line is formed on an electric circuit board. Specifically, the photoelectric circuit board of the present invention is a circuit board with an optical transmission line, wherein the optical transmission line has a core layer and a clad layer and the mount assembly of the present invention is disposed within the core layer. In another embodiment, the photoelectric circuit board of the present invention may have a constitution wherein the mount assembly of the present invention connects a plurality of optical transmission lines and receives an incident light signal that is emitted from at least one optical transmission line and emits a light signal corresponding to the incident light toward another optical transmission line(s).

The mount assembly of the present invention is characterized in that the photo-electro conversion device and/or the electro-photo conversion device is formed into a sphere and thereby the light-receiving portion and/or the light-emitting portion has a spherical face. This feature eases the requirement for perpendicularity at the connection portion between the optical transmission line such as an optical fiber and the mount assembly, and therefore facilitates connection of the mount assembly to the optical fiber compared with the conventional photoelectric conversion device. Further, the mount assembly of the present invention has a spherical semiconductor device connected to the photo-electro conversion device and/or the electro-photo conversion device, and therefore is made to be of a constitution having two spherical devices. In the case where this mount assembly is disposed at a bend portion or a branch portion, an incident light can be transmitted as an electrical signal at the bend portion or the branch portion, which results in a smaller transmission loss.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 10 shows a schematic view of an example of a method for producing the photoelectric circuit board of the ninth embodiment;

FIGS. 13A, 13B and 13C show schematic views of examples of methods for producing a spherical photoelectric conversion device for a mount assembly of the present invention, respectively; and FIG. 14 shows a schematic view of an example of a method for connecting two devices for a mount assembly of the present invention.

DETAILED DESCRIPTION OF THE PREFERRED EMBODIMENTS

First Embodiment

Figure 1:
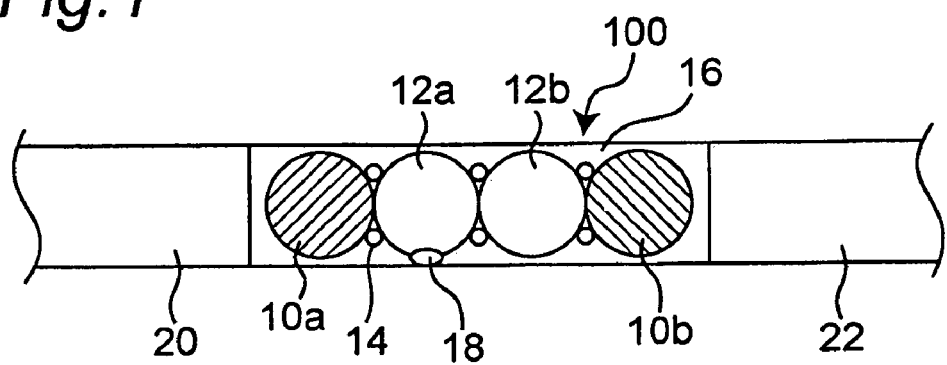
FIG. 1 shows a side view of a mount assembly as a first embodiment of the present invention.

FIG. 1 is a side view showing a first embodiment of the present invention. This embodiment is an example of a mount assembly which has a function of amplifying a light signal. This mount assembly may be used as, for example, an optical relay module for high-speed and high-capacity data communication.

This mount assembly 100 is disposed between two optical fibers 20 and 22 which are optical transmission lines. This mount assembly 100 amplifies a light signal that is emitted from the optical fiber 20 and then makes the light signal enter into the optical fiber 22. The mount assembly 100 has two spherical photoelectric conversion devices, and one of them is a photo-electro conversion device 10*a* and the other is an electro-photo conversion device 10*b*. The mount assembly 100 also has two spherical semiconductor devices 12*a* and 12*b* as an amplifier, which are disposed between the photoelectric semiconductor devices 10*a* and 10*b*. These four devices are arranged in a line and the adjacent devices are electrically connected with electrical-connection portions 14. The mount assembly 100 is entirely covered with a transparent resin 16. The transparent resin 16 is formed into a column having the same diameter as that of the optical fibers 20 and 22. Further, the mount assembly 100 has an external electrode 18 formed on the spherical semiconductor device 12*a*. This external electrode 18 is provided for connecting the spherical semiconductor amplifier 12*a* and a external power source (not shown). In the illustrated embodiment, the power source supplies electric power to activate the spherical semiconductor amplifiers 12*a* and 12*b*.

The photoelectric conversion device may be produced by forming a spherical n⁺ layer, a p⁺ layer and a doping area and electrodes 1310 according to a known method (for example, see U.S. Pat. No. 5,955,776 and U.S. Pat. No. 6,004,396) as shown in FIG. 13A. The device shown in FIG. 13A is an example of a PIN (p-intrinsic-n) diode. The size of the illustrated doping area is an example and may be larger. As the doping area is larger, a light-receiving region is larger and thereby the region can make a right angle with light signals in more directions. Alternatively, an electro-photo conversion device (LED) which emits a light in the direction of an arrow may be produced by forming a laminate which constitutes an LED and cutting and machining the laminate along the dotted line in the figure, as shown in FIG. 13B. Alternatively, the photoelectric conversion device may be produced by forming an electronic circuit on a sphere of semiconductor material according to a known method and then mounting optical devices 1300 on the circuit, as shown in FIG. 13C. In FIG. 13C, three optical devices are mounted and therefore lights in three directions can be received by this photoelectrical conversion device. The number and the position of the optical devices are not limited to the illustrated ones. For example, more optical devices may be mounted depending on the direction of the lights to be received.

In the photo-electro conversion device 10*a*, a predetermined electronic circuit is formed so that an electrical signal can be transmitted to the spherical semiconductor device 12*a*. Also in the electro-photo conversion device 10*b*, a predetermined electronic circuit is formed so that it can receive an electrical signal transmitted from the spherical semiconductor device 12*b*. Therefore, in the illustrated photo-electro conversion device 10*a*, a photoelectric conversion portion is formed at a part or the entire of the left-hand hemisphere as viewed in FIG. 1 and preferably at a position closest to the optical fiber 20. In the illustrated electro-photo conversion device 10*b*, a photoelectric conversion portion is formed at a part or the entire of the right-hand hemisphere as view in FIG. 1 and preferably at a position closest to the optical fiber 22.

The spherical semiconductor devices 12*a* and 12*b* may be produced according to the known method so that an electronic circuit of a desired function is formed. In the illustrated embodiment, the electronic circuit of the devices 12*a* and 12*b* is formed so that it functions as an amplifier. The number of the spherical semiconductor devices is not limited to two and the number is preferably selected depending on a necessary gain.

In the illustrated mount assembly, the electrical-connection portion 14 which connects the adjacent devices may be, for example, a solder or a conductive adhesive. In the illustrated mount assembly, the number of the electrical-connection portions 14 between two adjacent devices is two. The number may be larger than two.

The devices may be electrically connected by another means. For example, as shown in FIG. 14, the adjacent devices may be connected by a method wherein an ACF (anisotropic conductive film) 1400 is sandwiched by two spherical devices and then they are heated and pressurized at an appropriate temperature under an appropriate pressure. This method makes it possible to connect the adjacent devices easily and fix them stably.

Alternatively, the adjacent spherical devices may be connected by a method which includes the steps of forming metal bumps on either or both of the two adjacent devices; sandwiching an electrically insulating adhesive film which contains a semi-cured thermosetting resin between the two devices; and heating and pressurizing so that the metal bumps pierce the film and the thermosetting resin is cured. This method also gives an easy and secure connection and fixation. The metal bump may be formed of, for example, gold. The thermosetting resin may be, for example, an epoxy resin.

In addition to the electrical-connection portions 14, there is provided the external electrode 18 in the mount assembly 100 so as to feed the spherical semiconductor device 12*a*. The electric power to activate the devices 12*a* and 12*b* is supplied by the external power source (not shown) through this external electrode 18. A part of the external electrode 18 is not covered with the resin 16 so as to be exposed, whereby the connection between the electrode 18 and the external power source is ensured. The exposed part of the external electrode 18 is connected to the external power source using, for example, an appropriate lead wire. Alternatively, a pair of connectors may be provided at the exposed part of the external electrode 18 and the lead wire may be connected using the connector so as to supply the electric power.

The external electrode 18 may be a conventional metal electrode such as a gold electrode. In the case where a light should pass through this external electrode 18, the electrode 18 is preferably a transparent electrode formed of, for example, ITO (Indium-Tin-Oxide).

In the illustrated embodiment, the four spherical devices are entirely covered with the transparent resin 16. The transparent resin 16 is formed into a column having a diameter which is substantially the same as that of the optical fibers 20 and 22, whereby the mount assembly can be easily connected to the fibers 20 and 22. Further, both end portions of the columnar resin are machined with a high degree of precision so that a highly precise perpendicularity is achieved between an optical path of each fiber and the photoelectric conversions 10a and 10b at the end faces of the optical fibers 20a and 22 which contact with the devices 10a and 10b respectively. However, as described above, both of the photoelectric conversion devices 10a and 10b are spherical and accept deviation of the perpendicularity to some extent. For this reason, the requirement as to the perpendicularity is eased compared with the case of using a planar photoelectric conversion device, and therefore also the resin-machining precision is eased to some extent. This is an important feature of the present invention.

The transparent resin 16 is one or more resins selected from the group consisting of an acrylic resin, a polycarbonate resin, a polystyrene resin, a styrene-acrylonitrile copolymer (an AS resin), and an epoxy resin each of which has a high transparency. However, the resin 16 is not limited to these resins and any transparent resin having a good moldability may be used. The covering with the resin 16 is conducted after a predetermined number of photoelectric conversion devices 10a and 10b and the semiconductor devices 12a and 12b have been arranged into a desired shape (for example a line as shown in FIG. 1) and connected electrically. For example, the covering with the resin may be conducted by a method wherein the devices connected in the form of line are put in and fixed to a cylindrical metal mold and a molten resin is poured into the mold. Alternatively, the covering with the resin may be conducted by coating the mount assembly with the resin. In any method, it is necessary to prevent air bubbles from remaining in the resin covering. When the air bubbles remain in the resin, they cause an irregular reflection which results in a decrease in light transmission efficiency. In order to eliminate the air bubbles, pressurization or a vacuum degassing treatment may be preferably carried out while the resin is melted or uncured. The molding or coating is preferably conducted at a temperature as low as possible so as to avoid damaging each device. Further, the melting point of the resin 16 should be lower than the melting point or the softening point of the electrical-connection portion (that is, for example, a conductive adhesive) which connects the devices.

According to this embodiment, a columnar relay module which has substantially the same diameter as that of each of the optical fibers 20 and 22 can be obtained. This structure can provide a compact construction which is placed easily without increasing the size of the relay module between the optical fibers. Further, the shortest wiring arrangement is realized by contacting one device to another device, which makes it possible to transmit the signal without reducing the transmission speed.

The illustrated embodiment is one example of the mount assembly of the present invention and various modifications may be made to this embodiment. For example, a power may be supplied to the spherical semiconductor device by electromagnetic induction. In that case, a coil pattern may be formed on the spherical semiconductor device 12a. In the case where a large number of optical fibers are used in the form of bundle, the power supply with the use of the electromagnetic induction provides an advantage that a compact mount assembly can be obtained since the external electrode and the lead wire are not required.

The spherical semiconductor device may have one or more functions selected from a calculation function, a transmission function and a recording function in addition to the amplifying function. In a modification of this embodiment, the spherical semiconductor device may be one which provides a simple wiring when the light signal need not be amplified. Alternatively, the spherical semiconductor device may be one which has a 3R function (Re-shaping, Re-timing and Re-generating).

The mount assembly may include a planar photoelectric conversion device or a planer semiconductor device as long as either the photo-electro conversion device or the electro-photo conversion device is spherical and at least one spherical semiconductor device is included in the mount assembly. In the case where the planar device is used, it is necessary to form a through hole or a wire as an electrical connection means in a device-connection direction so that an electrical signal can be transmitted in the device-connection direction.

In the illustrated mount assembly, although all the devices are completely buried in the resin, the resin need not necessarily cover all the devices. For example, the resin may cover some of the devices and may not cover the other devices (that is, some of the devices may be exposed). Alternatively, a part of each device may be covered with the resin, and the other part of each device may be exposed. For example, the resin may cover only the photoelectric conversion portion of the photoelectric conversion device. In that case, the reliability of the mount assembly can be improved. Alternatively, the mount assembly has a constitution wherein a half of each device may be buried in a semi-cylindrical resin molding. Alternatively, the surface of each device may be covered with the resin in the form of a thin film. In that case, it is necessary to ensure the perpendicularity between the optical path of the optical fiber and the photoelectric conversion device using an appropriate connector since it is difficult to machine and form the end portions of the thin-film resin into connections to the optical fibers.

This mount assembly may further include a passive component such as a coil, a capacitor and a resistor. The passive component forms another circuit to provide an additional function to the mount assembly. The passive component may be mounted to, for example, the spherical semiconductor amplifier by a conventional method. Further, another active component may be mounted. In that case, a known planar semiconductor device may be used as the active component.

The mount assembly of this embodiment can be replaced with a single spherical semiconductor which functions as a semiconductor optical amplifier (SOA). When only one such spherical semiconductor device is used, two optical fibers can be connected with a shorter distance.

Second Embodiment

Figure 2:
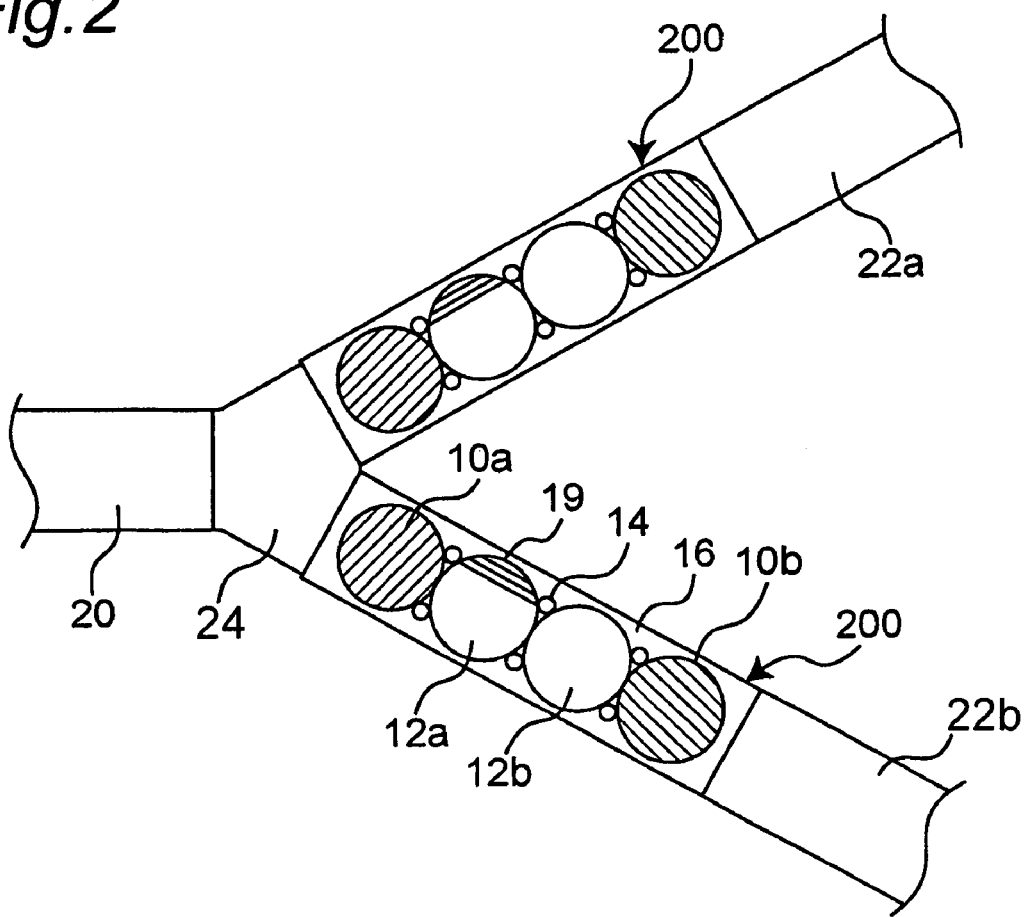
FIG. 2 shows a side view of a mount assembly as a second embodiment of the present invention.

FIG. 2 schematically shows a plan view of a second embodiment of the present invention. FIG. 2 shows an embodiment wherein mount assemblies 200 of the present invention are disposed in a branch portion of an optical fiber. When a signal is transmitted through the optical fiber, it is often necessary to divide the signal. The signal intensity may be reduced when dividing the signal optically, which is disadvantageous to the signal transmission. In order to avoid or reduce such disadvantage, the mount assembly of the present invention can be used. In the illustrated embodiment, a light signal transmitted through an optical fiber 20 is divided at a branch joint 24 and transmitted to right-hand optical fibers 22a and 22b respectively as viewed in FIG. 2. Each of the mount assemblies 200 of the present invention is provided as an optical relay module and disposed between the branch joint 24 and each of the optical fibers 22a and 22b to amplify the divided light signal and transmit the divided signal to each of the optical fibers 22a and 22b. The mount assemblies of the present invention disposed in this manner make it possible to transmit the divided light signals stably.

The construction of the mount assembly 200 is similar to that of the mount assembly 100 of the fist embodiment except that no external electrode is provided and a coil 19 is provided instead. The coil 19 is provided to supply electric power to the spherical semiconductor device 12a by electromagnetic induction. Therefore, the mount assembly 200 is provided in a more compact form since it need not be connected to a power supply. Other elements and construction are the same as those of the mount assembly 100 and therefore a detailed explanation thereof is omitted.

Third Embodiment

Figure 3:
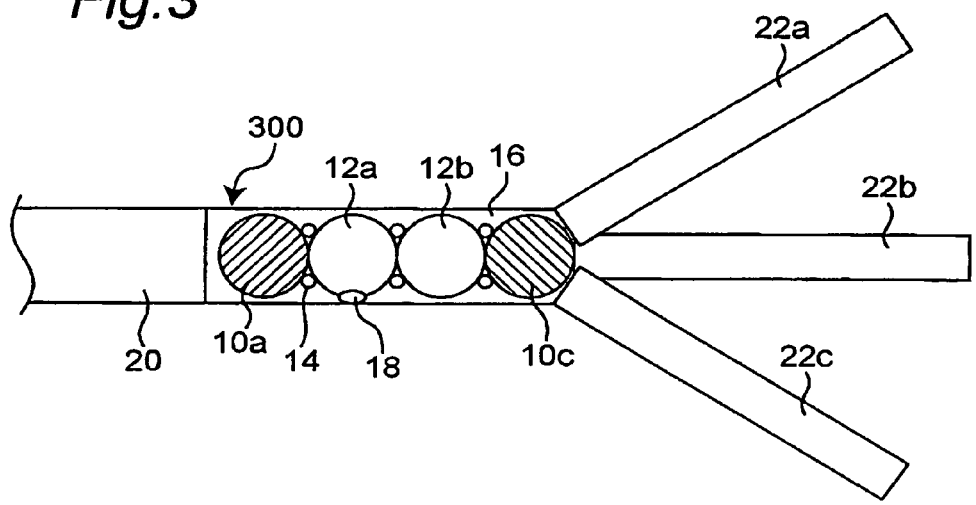
FIG. 3 shows a side view of a mount assembly as a third embodiment of the present invention.

FIG. 3 schematically shows a plan view of a third embodiment of the present invention. FIG. 3 shows another embodiment wherein an optical fiber is branched using a mount assembly 300 of the present invention.

In this embodiment, a light signal from an optical fiber 20 is divided and transmitted in a plurality (three in FIG. 3) of right-hand optical fibers 22a, 22b and 22c as viewed in FIG. 3. In the mount assembly 300 of the present invention, a electro-photo conversion device 10c is constructed so as to emit light in three directions. Also in the mount assembly 300, since the electro-photo conversion device 10c is spherical, light signals can be derived from a plurality of positions and coupled to a plurality of optical fibers when optical devices are disposed at three positions as shown in FIG. 13C or an entire semispherical surface close to the optical fibers 22a, 22b and 22c is made to be a light-emitting portion. A resin 16, which covers the mount assembly 300, is machined into a shape which forms a right angle with optical paths of three fibers respectively at the light-emitting side of the mount assembly 300. Other elements and construction of the mount assembly 300 are the same as those of the mount assembly 100 and therefore a detailed explanation thereof is omitted.

Fourth Embodiment

Figure 4:
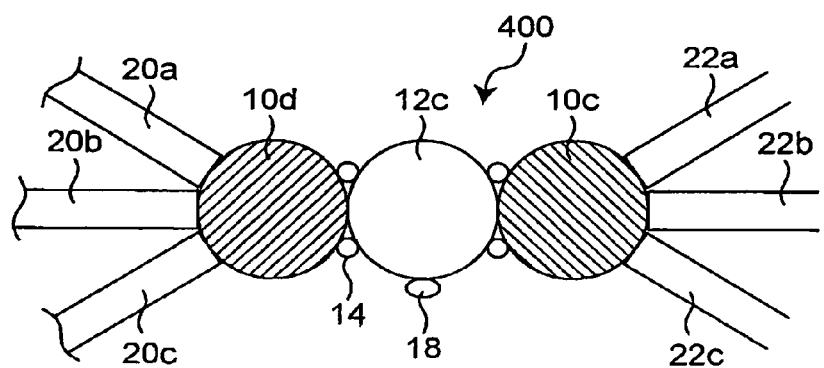
FIG. 4 shows a side view of a mount assembly as a fourth embodiment of the present invention.

FIG. 4 schematically shows a fourth embodiment of the present invention. FIG. 4 shows an embodiment wherein a mount assembly 400 of the present invention is used as an optical switch.

In this embodiment, each light signal transmitted from each of a plurality (three in FIG. 4) of optical fibers 20a–c is emitted toward one of a plurality (three in FIG. 4) of optical fibers 22a–c which is selected depending on an optical path of an incident light. The photo-electro conversion device 10d may be produced by forming doping regions at three positions as shown in FIG. 13A or mounting optical devices at three positions as shown in FIG. 13C, so that lights from a plurality of optical paths can be received by the device 10d. The photo-electro conversion device 10C may be manufactured so that the light can be emitted in a plurality of directions similarly to the third embodiment. An electronic circuit formed on a spherical semiconductor device 12c is formed so that it has a switching function which determines a path for emitting a light depending on the path of the incident light. Although the illustrated mount assembly 400 is not covered with a resin, a part or the entirety of the mount assembly may be covered with the resin. Other elements and construction of the mount assembly 400 are the same as those of the mount assembly 100 and therefore a detailed explanation thereof is omitted.

Fifth Embodiment

Figure 5:
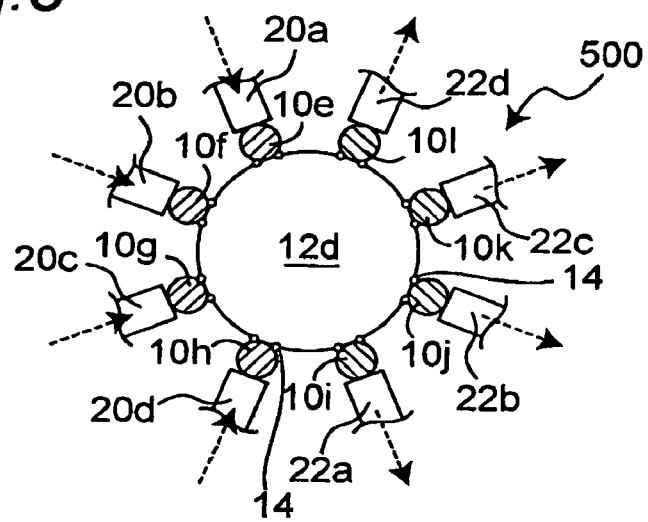
FIG. 5 shows a side view of a mount assembly as a fifth embodiment of the present invention.

FIG. 5 schematically shows a plan view of a fifth embodiment of the present invention. FIG. 5 shows another embodiment wherein a mount assembly 500 of the present invention is used as an optical switch.

In this embodiment, each of light signals transmitted from a plurality (four in FIG. 5) of optical fibers 20a–d is emitted toward a predetermined path which is selected from a plurality (four in FIG. 5) of paths 22a–d depending on a path of an incident light. This embodiment is different from the fourth embodiment in that photoelectric conversion devices 10e–l connected to optical fibers 20a–d are disposed around a single large spherical semiconductor device 12d. Such a mount assembly is in the scope of the present invention since a spherical semiconductor device can be said to be disposed between photo-electro conversion devices and electro-photo conversion device.

In the illustrated mount assembly 500, the photoelectric conversion devices 10e, 10f, 10 g and 10h are photo-electro conversion devices and the photoelectric conversion devices 10i, 10j, 10k and 10l are electro-photo conversion devices. An electronic circuit on the spherical semiconductor device 12d has a switching function which selects a predetermined electro-photo conversion device depending on the path of the incident light and enables a light signal to emit from the selected path. In the mount assembly 500, the photoelectric conversion devices 10e–l are connected to the spherical semiconductor device 12d through electrical-connection portions 14 in the same manner as in the first embodiment. Further, an external electrode (not shown) for connecting the mount assembly and an external power source is provided in the spherical semiconductor device 12d. A coil may be provided in the spherical semiconductor device 12d instead of the external electrode. Although the illustrated mounted assembly 500 is not covered with a resin, a part or the entire of the mount assembly may be covered with the resin if necessary.

Sixth Embodiment

Figure 6:
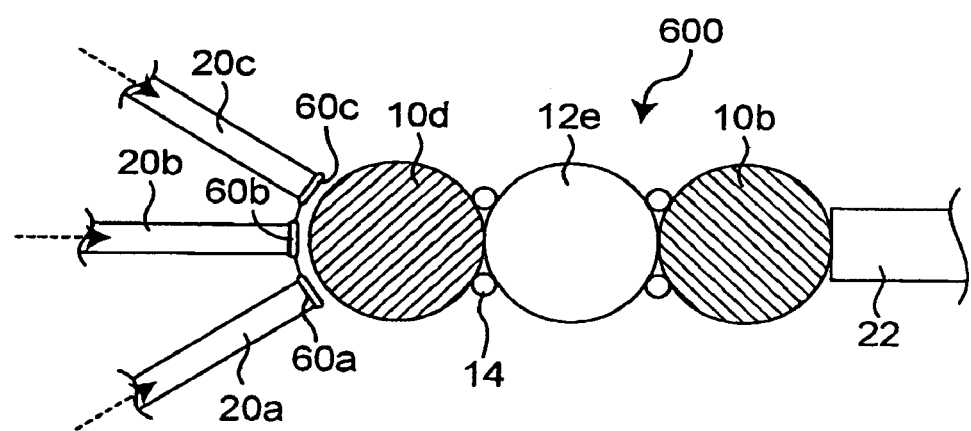
FIG. 6 shows a side view of a mount assembly as a sixth embodiment of the present invention.

FIG. 6 schematically shows a plan view of a sixth embodiment of the present invention. FIG. 6 shows an embodiment wherein a mount assembly 600 of the present invention is used as a wavelength switch.

In this embodiment, light signals transmitted from a plurality of (three in FIG. 6) optical fibers 20a, 20b and 20c pass through wavelength filters 60a, 60b and 60c which are attached to tips of the fibers and are converted into electrical signals by a photo-electro conversion device 10d. The electrical signal from one of the fibers 20a–c is amplified by a spherical semiconductor device 12e at an appropriate amplification factor depending on a wavelength and then converted to a light signal by an electro-photo conversion device 10b and emitted from an optical fiber 22. In other words, the mount assembly of the present invention recognizes a path of a received signal as a signal of a particular wavelength and serves to amplify the signal at an appropriate amplification factor depending on the wavelength to emit the signal. That is, the mount assembly of the present invention converts information with respect to a signal path into wavelength information.

In this embodiment, the filters 60a–c each of which allows a light having a particular wavelength to pass therethrough, are attached to the tips of the optical fibers 20a–c respectively. The filter 60a allows the passage of the light signal having a wavelength $\lambda 1$, the filter 60b allows the passage of the light signal having a wavelength λ2 and the filter 60c allows the passage of the light signal having a wavelength λ3. Therefore, in the case where the photo-electro conversion device 12e receives light signals having a wavelength λ1, the spherical semiconductor device 12e recognizes that it receives light signals from the optical fiber 20a and amplifies the signal and transmits the signal to the electro-photo conversion device 10b. The light signal having the wavelength λ1 is emitted from the optical fiber 22 and received by a receiver (not shown), whereby the receiver recognizes that the signal is emitted from the optical fiber 20a.

In this mount assembly 600, the photo-electro conversion device 10d is constructed so that it can receive light signals from a plurality of paths similarly to the photo-electro conversion device 10d shown in FIG. 4. The electro-photo conversion device 10b is similar to the electro-photo conversion device 10b shown in FIG. 1. The devices are electrically connected with electrical-connection portions 14 in the same manner as in the first embodiment. Further, the spherical semiconductor device 12e has an external electrode (not shown) for connecting with an external power source. A coil may be provided in the spherical semiconductor device 12e instead of the external electrode. The illustrated mount assembly 600 is not covered with a resin. A part or the entirety of the mount assembly may be covered with the resin if necessary.

Seventh Embodiment

Figure 7A:
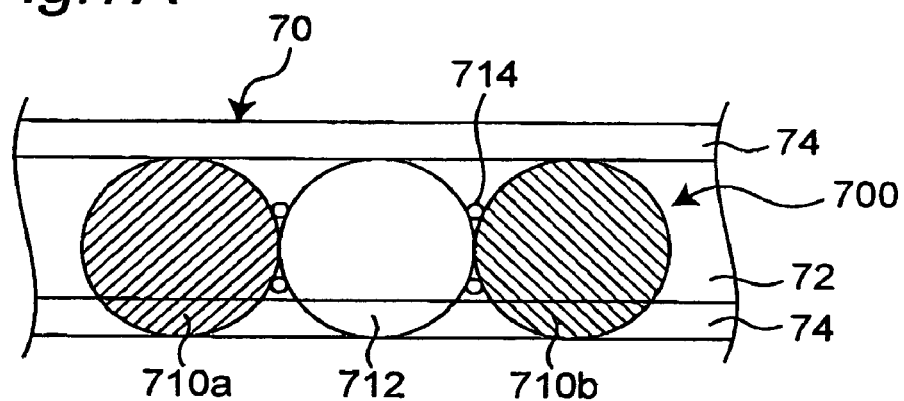
FIGS. 7A and 7B show a side view and a plan view of an optical transmission line as a seventh embodiment of the present invention and FIG. 7C shows a plan view of a conventional optical transmission line.
Figure 7B:
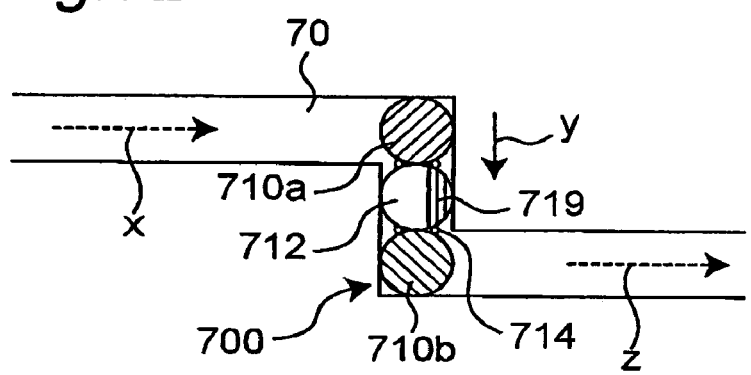
Figure 7C:
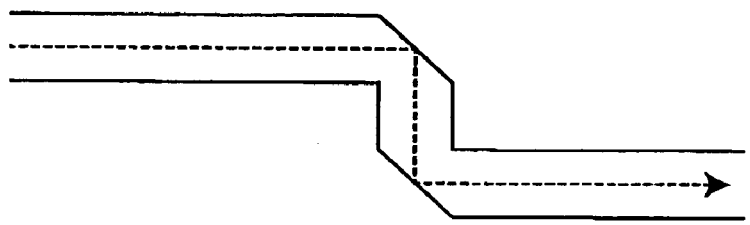

FIGS. 7A and 7B schematically show a plan view and a side elevation view of an optical transmission line of the present invention as a seventh embodiment of the present invention respectively and FIG. 7C schematically shows a plan view of a conventional optical transmission line. FIGS. 7A and 7B show an optical transmission line 700 including a core layer 72 and a clad layer 74 wherein a mount assembly 700 of the present invention is disposed within the core layer.

In the illustrated embodiment, a part of the mount assembly 700 of the present invention is disposed within the core layer 72 and the other part is disposed within the lower clad layer 74. The position of the mount assembly in the core layer is not limited to a particular position as long as the mount assembly can receive most of the signals transmitted through the core layer and a signal component other than the signal emitted from the mount assembly 700 cannot be transmitted beyond the mount assembly 700. In a modification of this embodiment, the mount assembly may be disposed, for example, only within the core layer without extending the clad layer.

This optical transmission line 70 includes two portions where an optical path bends at a right angle as shown in FIG. 7B. As shown in FIG. 7C, it is necessary to cut the optical transmission line at 45° and reflect a light signal at the cut face (a mirror face) so as to change the optical path in the conventional optical transmission line. When the mount assembly 700 of the present invention is disposed at the bend portions, a light signal propagating in the direction of an arrow "x" is converted by an electro-photo conversion device 710a into an electrical signal and transmitted in the direction of an arrow "y", and then the electrical signal is converted by a photo-electro conversion device 710b into a light signal and emitted in the direction of an arrow "z." In other words, by using the mount assembly of the present invention, the optical path change can be made without using the reflection of the light, whereby transmission loss which is accompanied by the optical path change can be smaller. Further, the optical transmission line of the present invention has the advantage that it is not necessary to cut the bend portion, and therefore an optical transmission line having a bend portion(s) can be formed easily.

In the mount assembly of the present invention, the spherical photoelectric conversion device allows a light signal in any direction to enter into the mount assembly, or allows a light signal to emit from the mount assembly in any direction. Therefore, also in the case where the optical transmission line bends at another angle other than a right angle, the optical path can be changed with a smaller transmission loss by adjusting a position of a photoelectric conversion portion with the use of the mount assembly of the present invention depending on the angle of the bend portion.

The construction of the mount assembly 700 disposed within the optical transmission line 70 of the present invention is similar to that of the mount assembly 200 which is described in connection with the second embodiment. The number of the spherical semiconductor device 712 is not limited to one, and two or more spherical semiconductor devices may be used depending on the length of the optical path and the size of the devices to be used. The devices are connected through the electrical-connection portions 714. The spherical semiconductor device 712 has an amplification function and it has a coil 719 such that electric power is supplied by electromagnetic induction. The spherical semiconductor device 712 may have a simple wire when the mount assembly is intended to be used only for changing the optical path. In the illustrated embodiment, the mount assembly 700 is not covered with a resin and is in direct contact with the core layer. This mount assembly is merely an example, and a mount assembly disposed within the optical transmission line of the present invention may be covered with the resin.

Eighth Embodiment

Figure 8A:
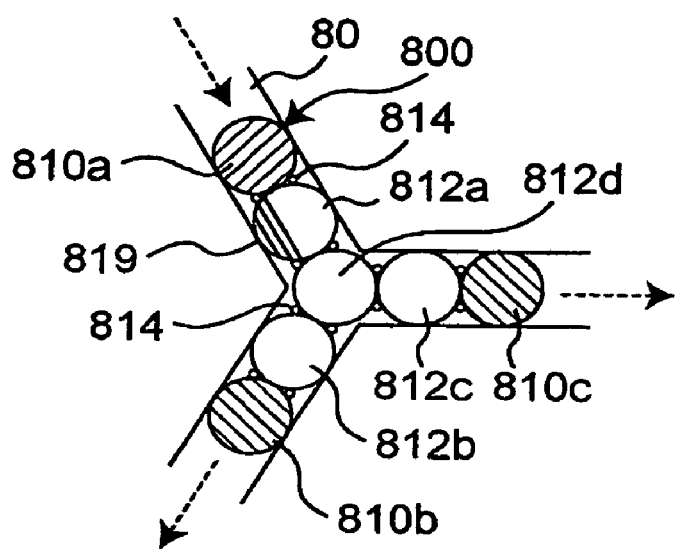
FIG. 8A shows an optical transmission line as an eighth embodiment of the present invention and FIG. 8B shows a plan view of a conventional optical transmission line.
Figure 8B:
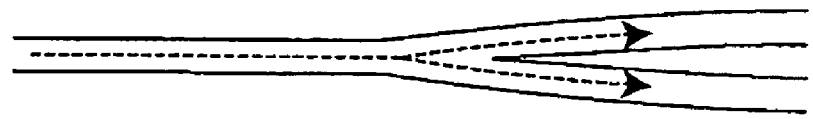

FIG. 8A schematically shows a plan view of an optical transmission line of the present invention as an eighth embodiment of the present invention and FIG. 8B schematically shows a conventional optical transmission line. An optical transmission line 80 of this embodiment has a core layer and a clad layer and a mount assembly 800 of the present invention disposed within the core layer similarly to the optical transmission line of the seventh embodiment.

The optical transmission line 80 has a branch portion as shown in FIG. 8A. As shown in FIG. 8B, in the conventional optical transmission line, a radius of curvature at the branch portion should be large in order to reduce the signal loss. For this reason, the area of the branch portion should be large. In the case where the mount assembly 800 of the present invention is placed so that spherical semiconductor devices 812a–d at the branch portion as shown in FIG. 8A, a light signal is divided into and transmitted as electrical signals. Therefore, the signal loss is significantly reduced compared with the light signal division. Further, since the electrical signal, not the light signal, is divided by using the mount assembly of the present invention in the optical transmission line of the present invention, the effect of the branch portion shape on the signal loss can be reduced and thereby the area of the branch portion can be smaller.

The illustrated mount assembly 800 has one photo-electro conversion device 810a and two electro-photo conversion devices 810b and 810c, and four spherical semiconductor devices 812a–d disposed therebetween. The spherical semiconductor device 812*a* has a function of amplifying an electrical signal from the photo-electro conversion device 810*a*. The spherical semiconductor device 812*d* has a function of dividing the electrical signal from the spherical semiconductor device 812*a* into the spherical semiconductor devices 812*b* and 812*c*. The spherical semiconductor devices 812*b* and 812*c* transmit the divided electrical signals to the electro-photo conversion devices 810*b* and 810*c*. The electro-photo conversion devices 810*b* and 810*c* convert the electrical signals into light signals and emit light in the directions of arrows. Feeding to the spherical semiconductor devices 812*a*–*d* is conducted by electromagnetic induction with the use of a coil 819 formed in the spherical semiconductor device 812*a*. The devices are connected through electrical-connection portions 814. In the illustrated embodiment, the mount assembly 800 is not covered with a resin. This mount assembly is merely an example, and the mount assembly disposed in the branch portion may be covered with the resin.

The illustrated mount assembly divides a light signal in one direction into light signals in two directions. The number of the branches may be three or more by increasing the number of electro-photo conversion devices and the spherical semiconductor devices. Further, the light signal may be selectively divided by imparting a switching function to a spherical semiconductor device (for example, the device denoted by "12*d*" in the illustrated embodiment).

Ninth Embodiment

Figure 9:
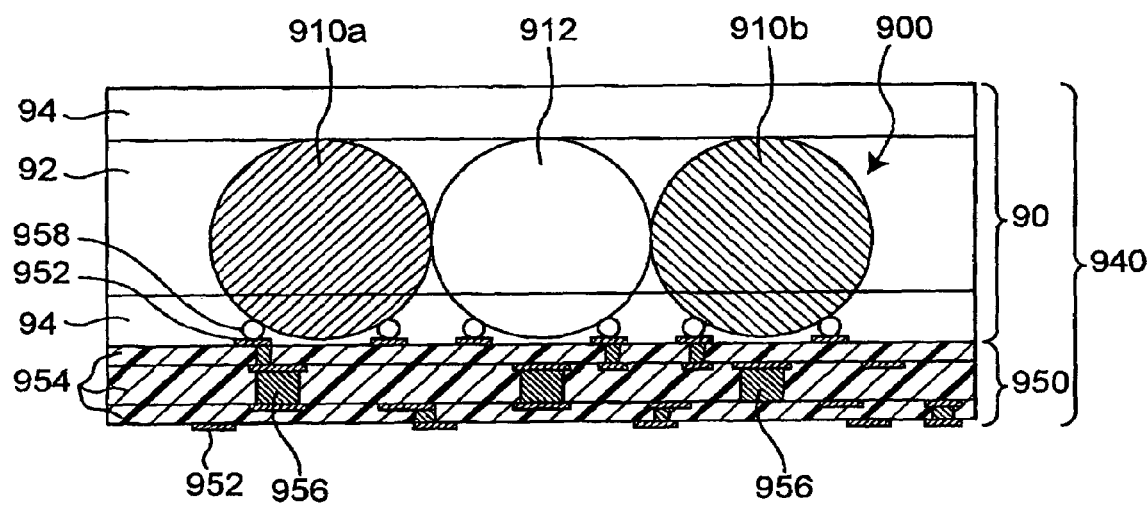
FIG. 9 shows a side view of a photoelectric circuit board as a ninth embodiment of the present invention.

FIG. 9 schematically shows a side elevation view of a photoelectric circuit board of the present invention as a ninth embodiment of the present invention. In FIG. 9, only a circuit board 950 is shown in a cross-sectional view in order to show the construction thereof. In a photoelectric circuit board 940 of this embodiment has a construction wherein an optical transmission line 90 is formed on the circuit board 950 and a mount assembly 900 of the present invention is disposed within the core layer 92.

The construction of the optical transmission line 90 has the core layer 92 and a clad layer 94 in the same manner as the optical transmission lines described with reference to FIGS. 7 and 8. Further, the mount assembly 900 is provided so as to amplify a light signal in the optical transmission line and it has a spherical photo-electro conversion device 910*a*, a spherical electro-photo conversion device 910*b* and a spherical semiconductor device 912 disposed therebetween. In the illustrated embodiment, the devices, which constitute the mount assembly 900, are mounted by connecting terminals 958 to a wiring layer 952 on a surface of a circuit board and the devices are electrically connected through the wiring layer 952. This connection technique is not different from any of the mount assemblies described above. In the illustrated embodiment, although three devices are arranged so that adjacent devices are in contact with each other, this contact is not necessarily required when the wiring layer 952 is used as the electrical-connection portion. Therefore, when using this connection technique, there may be a gap between the devices, which may advantageously effect an arrangement of the mount assembly and a design of the optical transmission line. For example, it will be understood that this connection technique is advantageous when there is not a space large enough to receive a mount assembly which has a plurality of devices integrated together. In a modification of this embodiment, the devices which constitute the mount assembly may be connected through the electrical-connection portions as described in connection with the first embodiment. In another modification of this embodiment, the connection through the wiring layer may be employed together with the connection through the electrical-connection portions.

The circuit board 950 is a known multilayer board which includes a plurality of wiring layers 952 and a plurality of electrical insulating layers 954 and inner vias 956 that connect the wiring layers. In a modification of this embodiment, a double-sided board or a single-sided board may be used instead of the multilayer board.

One example of a method for producing the photoelectrical circuit board of the ninth embodiment is described with reference to FIG. 10. Firstly, the terminals to connect a spherical device to the wiring layer are formed on the spherical device. The terminals 958 may be formed by attaching metal spheres 1010 disposed on a substrate to a surface of the photo-electro conversion device 910*a* with an adhesive or a solder, as shown in FIG. 10A. In FIG. 10A, two terminals are formed at the same time. Three or more terminals may be formed at the same time. However when the two terminals are formed in a wiring on a spherical surface, there is an advantage that an acceptable manufacturing tolerance can be increased. Next, as shown in FIG. 10B, the photo-electro conversion devices 910*a* are arranged on a substrate 1012 having recesses which receive the terminals. The arranged devices 910*a* are transferred to a surface of a disc-shaped substrate 1014, as shown in FIG. 10C. The transfer may be carried out, for example, by applying an adhesive to the surface of the substrate 1014 and contacting the surface with the devices 910*a* and then lifting the substrate 1014. As a result, as shown in FIG. 10D, a group of the photo-electro conversion devices 910*a* is formed on the surface of the substrate 1014. By repeating the steps shown in FIGS. 10A to 10C, the terminals are formed on the electro-photo conversion devices 910*b* and the spherical semiconductor devices 912 and these devices are transferred to the substrate 1014 so that three groups of the devices 910*a*, 910*b* and 912 are formed on the surface of the substrate 1014.

FIG. 10E shows a step of forming a lower clad layer 94 of the optical transmission line on the multilayer circuit board 950. The clad layer 94 may be formed using, for example, an uncured thermosetting resin or an ultraviolet curing resin. Next, a mount assembly 900 is mounted at a desired position. Specifically, as shown in FIG. 10F, the photo-electric conversion devices 910*a* and the wiring layer 952 are positioned by rotating the substrate 1014 shown in FIG. 10D and moving the multilayer board 950 having the clad layer 94 in a horizontal direction, and then the substrate 1014 is lowered to mount the device 910*a* to the circuit board 950. The photo-electro conversion device 910*a* is retained by the uncured clad layer 94 and connected to the wiring layer 952 by pressing the substrate 1014 against the clad layer 94. Therefore, when the substrate 1014 is lifted, the devices 910*a* which have been retained by the substrate 1014 with a weak adhesion leave the substrate 1014. The spherical semiconductor devices 912 and the electro-photo conversion devices 910*b* are mounted in a similar manner. Next, heat or an ultraviolet ray is applied to cure the clad layer 94. Next, the core layer 92 is applied as shown in FIG. 10G. The core layer 92 is formed into a desired pattern by, for example, an etching. Then an upper clad layer 94 is applied and heat or an ultraviolet ray is applied, whereby the photoelectric circuit board 940 of the ninth embodiment is obtained.

The illustrated method is merely an example, and other known techniques for mounting a spherical device may be used to produce a photoelectrical circuit board of the present invention. Further, by applying the illustrated production method, the mount assembly of the first embodiment can be produced. For example, a mount assembly wherein the terminals 958 are the electrical-connection portions can be obtained by stacking the devices sequentially with use of the substrate shown in FIG. 10D.

Tenth Embodiment

Figure 11:
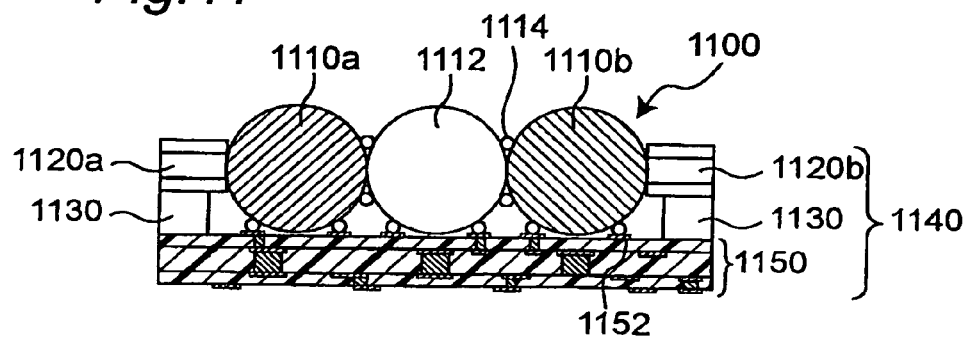
FIG. 11 shows a schematic view of a photoelectric circuit board as a tenth embodiment of the present invention.

FIG. 11 schematically shows a side elevation view of another photoelectrical circuit board of the present invention as a tenth embodiment of the present invention. In an illustrated photoelectrical circuit board 1140, a mount assembly 1100 of the present invention optically connects two optical transmission lines 1120a and 1120b.

The optical transmission lines 1120a and 1120b are, for example, optical fibers. In the illustrated embodiment, each of the optical transmission lines 1120a and 1120b is supported by an appropriate support member 1130 (for example an adhesive or a resin layer). A circuit board 1150 has a construction similar to that of the circuit board 950 in the ninth embodiment.

This photoelectric circuit board 1140 is different from the ninth embodiment in that the mount assembly 1100 is not disposed inside the optical transmission line. In this circuit board, the mount assembly 1100 includes a photo-electric conversion device 1110a which converts a light signal emitted from the optical transmission line 1120a into an electrical signal, a spherical semiconductor device 1112 having an amplifying function and a electro-photo conversion device 1110b which converts the electrical signal to a light signal to emit the light signal toward the optical transmission line 1120b. The mount assembly 1100 is mounted to a wiring layer 1152 of the circuit board 1150 and the devices are connected through the wiring layer 1152 in the same manner as in the ninth embodiment. Further, in this mount assembly 1100, the adjacent devices are electrically connected by contacting each other through the electrical-connection portions 1114.

This embodiment can be said to be an embodiment wherein any of the first, second, third and fourth embodiments described with reference to FIGS. 1 to 4 is realized on a circuit board. Therefore, as described in connection with the first to the fourth embodiments, the mount assembly may be constructed to divide a light signal emitted from one optical transmission line into a plurality of optical transmission lines or may be constructed to serves as an optical switch.

Eleventh Embodiment

Figure 12:
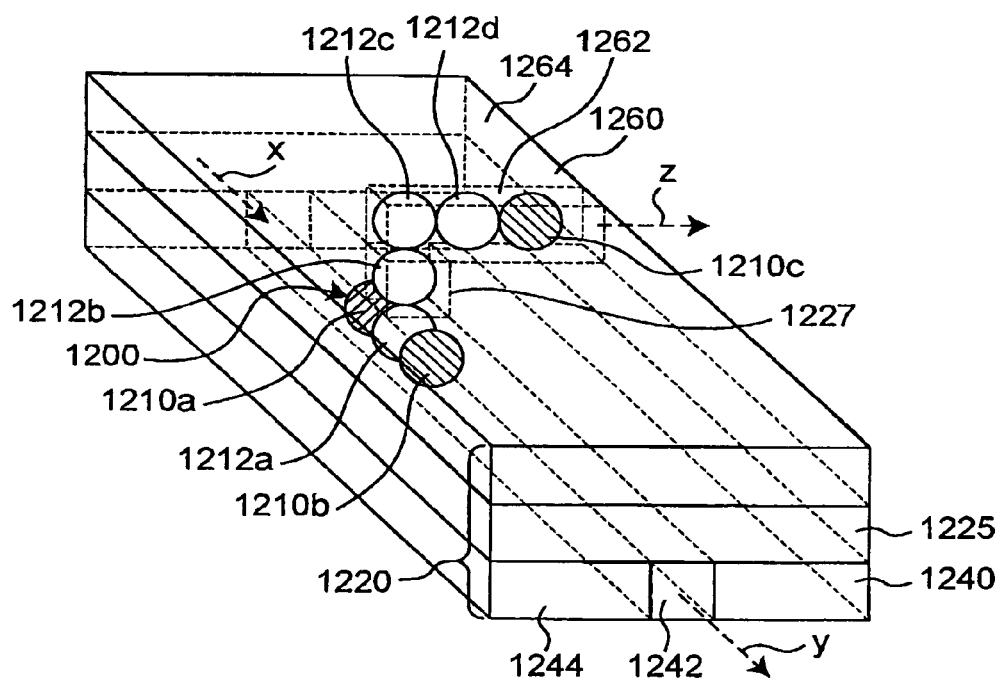
FIG. 12 shows a perspective view of an optical transmission line as an eleventh embodiment of the present invention.

FIG. 12 schematically shows a perspective view of an embodiment of a two-layer optical transmission line as an eleventh embodiment of the present invention. FIG. 12 illustrates that, in a two-layer optical transmission line, a light signal which enters into one end of a first optical transmission line 1240 from the direction of an arrow "x" is emitted from the other end of the first optical transmission line 1240 in the direction of an arrow "y" and also divided by a mount assembly 1200 of the present invention and emitted from a second optical transmission line 1260. The optical transmission line 1220 corresponds to a modification of the eighth embodiment and is different from the eighth embodiment in that the light signal is divided three-dimensionally.

In the optical transmission line 1220, the first optical transmission line 1240 includes a core layer 1242 and a clad layer 1244 and may further include a lower clad layer if necessary. Also the second optical transmission line 1260 includes a core layer 1262 and a clad layer 1264 and may further include an upper clad layer if necessary. A layer 1225 is provided in order to separate two optical transmission lines except for a position where a spherical semiconductor device 1210b is placed as shown and the layer 1225 may be generally a clad layer.

A mount assembly 1200 of the present invention shown in FIG. 12 includes a photo-electro conversion device 1210a, a spherical semiconductor device 1212a and an electro-photo conversion device 1210b which are provided for receiving a light signal at one end of the optical transmission line 1240 and emitting the light signal from the other end, and the mount assembly 1200 further includes a spherical semiconductor device 1212b, 1212c and 1212d and an electro-photo conversion device 1210c. For example, the photo-electro conversion device 1210a, the spherical semiconductor device 1212a and the electro-photo conversion device 1210b amplifies a light signal which passes through the core layer 1242 of the optical transmission line 1220. In that case, the spherical semiconductor device 1212a has an amplifying function. The spherical semiconductor device 1212b is electrically connected to the spherical semiconductor devices 1212a and 1212c to serve to connect the optical transmission lines 1240 and 1260 and has a simple wire or an amplifier circuit. The spherical semiconductor devices 1212c and 1212d and the electro-photo conversion device 1210c are placed within the core layer 1262 of the optical transmission line 1260. The spherical semiconductor devices 1212c and 1212d have an amplifying circuit or a simple wire so that a desired light signal can be taken from the optical transmission line 1260. By using the spherical semiconductor devices, a plurality of optical transmission lines can be connected three-dimensionally. In the figure, electrical-connection portions between the devices and so on are omitted for simplicity.

For example, the three-dimensional arrangement of the mount assembly 1200 may be obtained according to the following procedures. Firstly, the devices 1210a, 1212a, and 1210b are disposed within the core layer 1242. Next, the device 1212b is connected to the device 1212a and enclosed with a resin 1227. The resin 1227 may be a resin for the core layer. Next, the layer 1225 is formed so that a portion of the device 1212b is exposed. Subsequently, the clad layer 1264 is formed and a portion which corresponds to the core layer is removed. Next the devices 1212c, 1212d and 1210c are disposed in the portion and then the core layer 1262 is formed, resulting in the optical transmission line 1220 as shown in FIG. 12.

This optical transmission line 1220 may be an optical transmission line of a photoelectric circuit board of the ninth embodiment. In other words, the optical transmission line 1220 may be formed on a surface of a circuit board.

The mount assembly of the present invention may be provided in various forms utilizing the omnidirection of a spherical device. Therefore, the mount assembly of the present invention makes it possible to optically connect two or more optical transmission lines efficiently. Further, in the case where the mount assembly of the present invention is disposed within the optical transmission line, an optical path can be changed without a low transmission loss.

What is claimed is:

1. A mount assembly which emits a light signal corresponding to an incident light signal, the mount assembly comprising:
   at least two photoelectric conversion devices; and
   at least one spherical semiconductor device which forms an electronic circuit,
   wherein at least one of the photoelectric conversion devices is a device for converting a light signal to an electrical signal and at least one of the photoelectric conversion devices is a device for converting an electrical signal to a light signal,
   wherein at least one of the photoelectric conversion devices is a spherical photoelectric conversion device which has a photoelectric conversion portion formed on a surface of a substantially spherical semiconductor material,
   wherein the spherical semiconductor device is disposed between the device for converting the light signal to the electrical signal and the device for converting the electrical signal to the light signal, and
   wherein the devices are electrically connected.

2. The mount assembly according to claim 1, further comprising a circuit board,
   wherein the photoelectric conversion devices and the spherical semiconductor device are mounted on a surface of the circuit board and the photoelectric conversion devices and the spherical semiconductor device are electrically connected through a wire of the circuit board.

3. The mount assembly according to claim 1, wherein the devices are electrically connected by contacting with each other through an electrical-connection portion.

4. The mount assembly according to claim 1, which comprises:
   "n" spherical photoelectric conversion devices as the photoelectric conversion devices, wherein "n" is an integer equal to or more than two; and
   "x" spherical semiconductor devices as the spherical semiconductor device, wherein "x" is an integer equal to or more than one,
   wherein "a" spherical photoelectric conversion devices convert a light signal to an electrical signal, wherein "a" is an integer equal to or more than one and a<n, and
   "n−a" spherical photoelectric conversion devices convert an electrical signal to a light signal.

5. The mount assembly according to claim 4, wherein "n" is two and "x" is one, and the spherical photoelectric conversion devices and the spherical semiconductor device are arranged in a line and the two spherical photoelectric conversion devices are disposed at both ends of the line.

6. The mount assembly according to claim 4, wherein "n" is three or more and "x" is one or more, and an incident light signal in one direction is divided into two or more directions.

7. The mount assembly according to claim 1, wherein the spherical photoelectric conversion device converts a light signal to an electrical signal and receives light signals emitted from a plurality of optical transmission lines.

8. The mount assembly according to claim 7, wherein the spherical semiconductor device which is electrically connected to the spherical photoelectric conversion device forms an electronic circuit for amplifying a received light signal at an appropriate amplification factor depending on a wavelength of the received light signal.

9. The mount assembly according to claim 1, wherein the spherical photoelectric conversion device converts an electrical signal to a light signal and emits light signals in a plurality of optical transmission lines.

10. The mount assembly according to claim 1, wherein a part or the entire of the mount assembly is covered with a transparent resin.

11. The mount assembly according to claim 10, wherein the transparent resin is selected from a group consisting of an acrylic resin, a polycarbonate resin, a polystyrene resin, a styrene-acrylonitrile copolymer and an epoxy resin.

12. The mount assembly according to claim 1, which includes a passive component mounted thereon.

13. An optical transmission line comprising a core layer and a clad layer, wherein the mount assembly according to claim 1 is disposed within the core layer.

14. The optical transmission line according to claim 13, which has a bend portion in which the mount assembly is disposed.

15. The optical transmission line according to claim 13, which has a branch portion in which the mount assembly is disposed.

16. A multilayer optical transmission line having two or more layers each of which has an optical transmission line comprising a core layer and a clad layer, wherein the mount assembly according to claim 1 is disposed across two layers and divides or change the optical transmission line of one layer to the optical transmission line of another layer.

17. A photoelectric circuit board comprising an optical transmission line, wherein the optical transmission line comprises a core layer and a clad layer and the mount assembly according to claim 1 is disposed within the core layer.

18. A photoelectric circuit board comprising a plurality of optical transmission lines, wherein the mount assembly according to claim 1 connects the optical transmission lines and transmits a light signal corresponding to a light that is emitted from at least one of the optical transmission lines, to the other of the optical transmission lines.

* * * * *

UNITED STATES PATENT AND TRADEMARK OFFICE
CERTIFICATE OF CORRECTION

| | | |
|---|---|---|
| PATENT NO. | : 7,136,543 B2 | Page 1 of 1 |
| APPLICATION NO. | : 10/879067 | |
| DATED | : November 14, 2006 | |
| INVENTOR(S) | : Tousaku Nishiyama et al. | |

It is certified that error appears in the above-identified patent and that said Letters Patent is hereby corrected as shown below:

ON THE TITLE PAGE

Item (75) Inventors, please add --Seiichi Nakatani, Osaka (JP)--.

Under U.S. PATENT DOCUMENTS, in the right column, line 6, "Nakata" should read --Nishiyama et al.--.

Signed and Sealed this

Twenty-seventh Day of March, 2007

JON W. DUDAS
*Director of the United States Patent and Trademark Office*